(12) United States Patent
Mori

(10) Patent No.: US 6,927,111 B2
(45) Date of Patent: Aug. 9, 2005

(54) METHOD FOR FABRICATING SEMICONDUCTOR DEVICE

(75) Inventor: Toshifumi Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,359

(22) Filed: Oct. 28, 2003

(65) Prior Publication Data

US 2004/0087073 A1 May 6, 2004

(30) Foreign Application Priority Data

Oct. 29, 2002 (JP) ........................................ 2002-314329

(51) Int. Cl.[7] ........................................... H01L 21/336
(52) U.S. Cl. .................... 438/197; 438/787; 438/778
(58) Field of Search ........................................ 438/197

(56) References Cited

U.S. PATENT DOCUMENTS

| | | | | |
|---|---|---|---|---|
| 4,985,372 A | * | 1/1991 | Narita ......................... | 438/685 |
| 6,130,132 A | * | 10/2000 | Hsieh et al. ................ | 438/264 |
| 6,627,494 B2 | * | 9/2003 | Joo et al. .................... | 438/240 |
| 6,689,645 B2 | * | 2/2004 | Houng et al. ............... | 438/143 |
| 2002/0151122 A1 | * | 10/2002 | Kobayashi ................... | 438/196 |
| 2003/0022526 A1 | * | 1/2003 | Vyvoda et al. .............. | 438/788 |
| 2003/0227047 A1 | * | 12/2003 | Hsu et al. .................... | 257/314 |

OTHER PUBLICATIONS

Wei W. Lee, et al.; Fabrication of 0.06 μm Poly–Si Gate Using DUV Lithography with a Designed $Si_xO_yN_z$ Film as an Arc and Hardmask; 1997 Symposium on VLSI Technology Digest of Technical Papers; pp. 131 & 132; 1997.

* cited by examiner

Primary Examiner—Thao P. Le
(74) Attorney, Agent, or Firm—Westerman, Hattori, Daniels & Adrian, LLP (57) ABSTRACT

A method for fabricating a semiconductor device comprises the steps of: forming a polysilicon film 26 on a silicon substrate 10; removing a natural oxide film 28 on the surface of the polysilicon film 26; forming a homogeneous chemical oxide film 30 on the surface of the polsysilicon film 26 having the natural oxide film 28 removed; forming a silicon oxide film 32 to be used as a hard mask on the polysilicon film 26 with the chemical oxide film 30 formed on; and etching the polysilicon film 26 with the silicon oxide film 32 as a mask to form a gate electrode 16 of the polysilicon film 26.

16 Claims, 7 Drawing Sheets

METHOD FOR FABRICATING SEMICONDUCTOR DEVICE

CROSS-REFERENCE TO RELATED APPLICATION

This application is based upon and claims priority of Japanese Patent Application No. 2002-314329, filed on Oct. 29, 2002, the contents being incorporated herein by reference.

BACKGROUND OF THE INVENTION

The present invention relates to a method for fabricating a semiconductor device, more specifically a method for fabricating a semiconductor device, which can form a micronized gate electrode.

Recently, with the higher speed and higher integration of super-LSIs (Large Scale Integrated Circuits), the gate length is required to be shorter, and the parasitic capacitance is required to be smaller. To meet such requirements, the exposure light used in the photolithography is short-wavelength light, such as ArF excimer laser beams. In accordance therewith, photoresist materials for the micronized pattern exposure by the short-wavelength exposure light are developed.

However, the photoresist material used in the photolithography using the ArF excimer laser as the exposure light source has a disadvantage of poor resistance to plasma etching. Accordingly, when micronized gate electrodes are patterned, hard masks of oxide film, nitride film, etc. are used together with resists for the micronized pattern exposure (refer to, e.g., Wei W. Lee et al., "FABRICATION OF 0.06 $\mu$m POLY-Si GATE USING DUV LITHOGRAPHY WITH A DESIGNED $Si_xO_yH_z$ FILM AS AN ARC AND HARDMASK" IEEE 1997 Symposium on VLSI Technology Digest of Technical Papers, p.131).

However, the above-described conventional method for fabricating a semiconductor device which patterns gate electrodes, using a hard mask has disadvantages such that when micronized gate electrodes of, e.g., a ~50 nm line width are etched, the etching rate is varied. The above-described conventional method for fabricating a semiconductor device has found it difficult to form micronized gate electrodes with good yields.

SUMMARY OF THE INVENTION

An object of the present invention is to provide a method for fabricating a semiconductor device which can form micronized gate electrodes with high yields.

According to one aspect of the present invention, there is provided a method for fabricating a semiconductor device comprising the steps of: forming a film containing a silicon above a semiconductor substrate; removing a natural oxide film on the surface of the film; forming an oxide film on the surface of the film with the natural oxide film removed; forming a mask on the oxide film formed on the surface of the film; and etching the film with the mask to form a gate electrode including the film.

According to another aspect of the present invention, there is provided a method for fabricating a semiconductor device comprising the steps of: forming a film containing a silicon above a semiconductor substrate with a gate insulation film formed therebetween; exposing the semiconductor substrate to the atmosphere; removing a natural oxide film formed on the surface of the film; forming an oxide film on the surface of the film with the natural oxide film removed; forming a mask on the oxide film formed on the surface of the film; and etching the film with the mask to form a gate electrode including the film.

According to further another aspect of the present invention, there is provided a method for fabricating a semiconductor device comprising the steps of: forming a film containing a silicon above a semiconductor substrate; forming a mask on the film without exposing the surface of the film to the atmosphere; and etching the film with the mask to form a gate electrode including the film.

According to further another aspect of the present invention, there is provided a method for fabricating a semiconductor device comprising the steps of: forming a film containing a silicon above a semiconductor substrate; forming an oxide film on the surface of the film without exposing the surface of the film to the atmosphere; forming a film to be a mask on the oxide film formed on the surface of the film; forming a resist film on the film to be the mask and exposing and developing the resist film with exposure light having a wavelength of 200 nm or below to form a resist pattern; patterning the film to be the mask with the resist pattern to form the mask; and etching the film with the mask to form a gate electrode including the film.

As described above, according to the present invention, a conducting film of a silicon-based conducting material is formed above a semiconductor substrate; a natural oxide film on the surface of the conducting film is removed; an oxide film is formed on the surface of the conducting film having the natural oxide film removed; a mask is formed on the oxide film formed on the surface of the conducting film; and the conducting film is etched with the mask to form a gate electrode including the conducting film, whereby when silicon-based semiconductor material is used as the gate electrode material, the generation of the residual gate electrode material on forming the gate electrode can be suppressed, which allows the micronized gate electrode to be formed with high yields.

According to the present invention, a conducting film of a silicon-based semiconductor material is formed above a semiconductor substrate with a gate insulation film formed therebetween; the semiconductor substrate is exposed to the atmosphere; a natural oxide film formed thereby on the surface of the conducting film is removed; an oxide film is formed on the surface of the conducting film having the natural oxide film removed; a mask is formed on the oxide film formed on the surface of the conducting film; and the conducting film is etched with the mask to form a gate electrode including the conducting film, whereby when silicon-based semiconductor material is used as the gate electrode material, the generation of the residual gate electrode material on forming the gate electrode can be suppressed, which allows the micronized gate electrode to be formed with high yields.

According to the present invention, a conducting film of a silicon-based semiconductor material is formed above a semiconductor substrate; a mask is formed on the conducting film without exposing the surface of the conducting film to the atmosphere; and the conducting film is etched with the mask to form a gate electrode including the conducting film, whereby when silicon-based semiconductor material is used as the gate electrode material, the generation of the residual gate electrode material on forming the gate electrode can be suppressed, which allows the micronized gate electrode to be formed with high yields.

According to the present invention, a conducting film of a silicon-based semiconductor material is formed above a semiconductor substrate; an oxide film is formed on the surface of the conducting film without exposing the surface of the conducting film to the atmosphere; a film to be a mask is formed on the oxide film formed on the surface of the conducting film; a resist film is formed on the film to be the mask and the resist film is exposed and developed with exposure light having a wavelength of 200 nm or below to form a resist pattern; the film to be the mask is patterned with the resist pattern to form the mask; and the conducting film is etched with the mask to form a gate electrode including the conducting film, whereby when silicon-based semiconductor material is used as the gate electrode material, the generation of the residual gate electrode material on forming the gate electrode can be suppressed, which allows the micronized gate electrode to be formed with high yields.

DETAILED DESCRIPTION OF THE INVENTION

[Principle of the Present Invention]

As described above, when gate electrodes are patterned, using a hard mask, residues of a gate electrode material often take place in the region other than the regions for the gate electrodes to be formed in. The inventor of the present application has made earnest studies of causes for this phenomenon and found for the first time the mechanism for the generation of the residues of a gate electrode material, as explained below.

The mechanism for the generation of the residues the inventor of the present application has made clear will be explained with reference to the steps of fabricating a gate electrode shown in FIGS. 1A–1E.

Figure 1A:
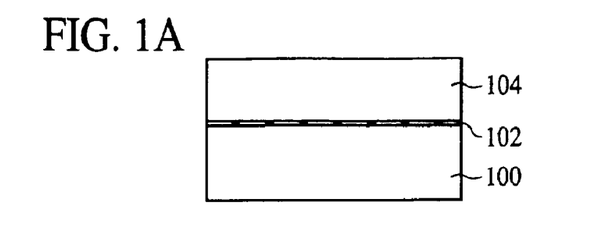
FIGS. 1A–1E are sectional views showing the steps of forming a gate electrode.

First, a polysilicon film 104 is formed on a silicon substrate 100 with a gate insulation film 102 therebetween by, e.g., low pressure CVD (Chemical Vapor Deposition) (refer to FIG. 1A). The polysilicon film 104 is usually formed in a batch-type film forming system, where the polysilicon film 104 is formed simultaneously on a plurality of silicon substrates 100.

After the polysilicon film 104 is formed, the interior of the film forming chamber of the batch-type film forming system is exposed to the atmosphere with the surface of the polysilicon film 104 exposed to the atmosphere. Resultantly, an inhomogeneous natural oxide film 106 is formed on the surface of the polysilicon film 104 (refer to FIG. 1B).

Figure 1B:
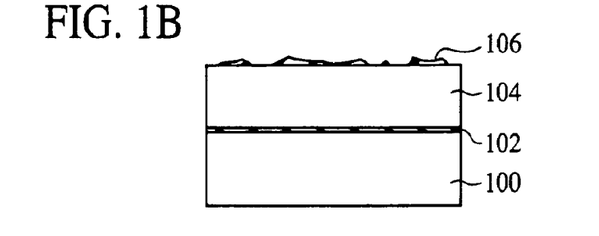

Then, a silicon nitride film 108 to be used as a hard mask is formed on the polysilicon film 104 by, e.g., CVD. Here, in the conventional gate electrode forming process, no special processing for the purpose of removing the natural oxide film 106 formed on the surface of the polysilicon film 104 has not been made. Accordingly, the inhomogeneous natural oxide film 106 resides in the interface between the silicon nitride film 108 to be used as a hard mask and the polysilicon film 104.

Figure 1C:
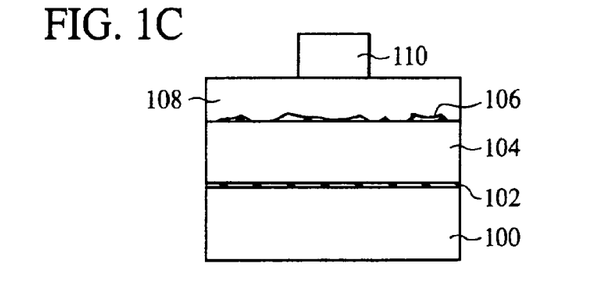
Figure 1D:
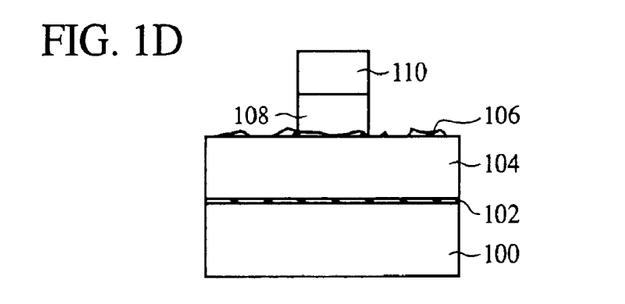

Then, a resist film 110 is formed on the silicon nitride film 108 and is left on a region for a gate electrode to be formed in (refer to FIG. 1C).

Next, with the resist film 110 as the mask, the silicon nitride film 108 is etched. At this time, on the surface of the polysilicon film 104 exposed in the region where the silicon nitride film 108 has been etched off, the inhomogeneous natural oxide film 106 resides (refer to FIG. 1D).

Figure 1E:
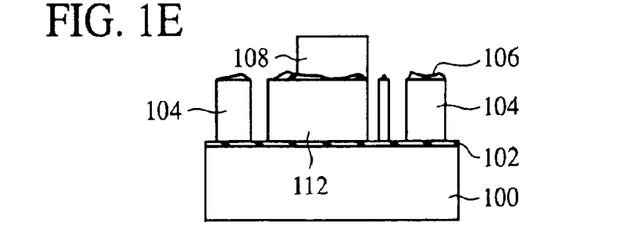

Then, with the resist film 110 and the silicon nitride film 108 as the mask, the polysilicon film 104 is patterned by dry etching to form a gate electrode 112 of the polysilicon film 104.

The etching of the polysilicon film 104 for forming the gate electrode 112 is performed under a condition which provides a sufficiently large selectivity ratio of silicon to silicon oxide. On the other hand, the inhomogeneous natural oxide film 106 is formed on the surface of the polysilicon film 104. When the gate electrode 112 is formed, the natural oxide film 106 on the surface of the polysilicion film 104 acts as the mask for the etching. Resultantly, the polysilicon film 104 to be etched cannot be uniformly etched, with a result that the polysilicon film 104 remains in the region other than the region for the gate electrode to be formed in.

As explained above, it happens that the polysilicon film 104 remains in the region other than the region for the gate electrode to be formed in because of the existence of the inhomogeneous natural oxide film 106 formed on the surface of the polysilicon film 104.

Accordingly, it can be said that the inhomogeneous natural oxide film 106 formed on the surface of the polysilicon film 104 is removed before the gate electrode is patterned, whereby the residues of the polysilicon film 104 in the region other than the region for the gate electrode to be formed in can be suppressed.

Otherwise, it can be said that after the polysilicon film 104 is formed, the oxidation of the surface of the polysilicon film 104 is suppressed to thereby suppress the formation of the natural oxide film 106, whereby the residues of the polysiliocn film 104 in the region other than the region for the gate electrode to be formed in can be suppressed.

The present invention has been made based on the above-described knowledge. The present invention will be detailed below by means of a first embodiment and a second embodiment.

[A First Embodiment]

The method for fabricating a semiconductor device according to a first embodiment of the present invention will be explained with reference to FIGS. 2A–2C, 3A–3C, 4A–4C, 5A–5C and 6A–6B. FIGS. 2A–2C, 3A–3C, 4A–4C, 5A–5C and 6A–6B are sectional views of a semiconductor device in the steps of the method for fabricating a semiconductor device according to the present embodiment, which show the method.

The method for fabricating a semiconductor device according to the present embodiment removes the natural oxide film formed on the surface of a polysilicon film to be patterned into a gate electrode and forms a homogeneous chemical oxide film in place of the natural oxide film, whereby the generation of residues of the polysilicon film is suppressed to thereby form a micronized gate electrode.

Figure 2A:
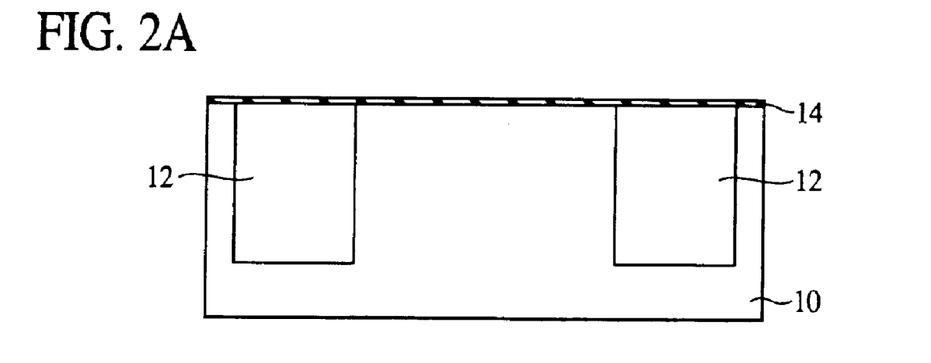
FIGS. 2A–2C are sectional views of a semiconductor device in the steps of the method for fabricating the semiconductor device according to a first embodiment of the present invention, which show the method (Part 1).

An element isolation film 12 is formed by, e.g., STI (Shallow Trench Isolation) method, buried in a silicon substrate 10 to define an element region in the silicon substrate 10. The element isolation film 12 may be formed by the usual LOCOS (LOcal Oxidation of Silicon) method to thereby define the element region in the silicon substrate 10.

Next, the silicon substrate 10 with the element isolation film 12 formed in is thermally oxidized to form a gate insulation film 14 of a silicon oxide film of, e.g., a 1.2 nm-thickness on the silicon substrate 10 in the element region defined by the element isolation film 12 (refer to FIG. 2A).

Figure 2B:
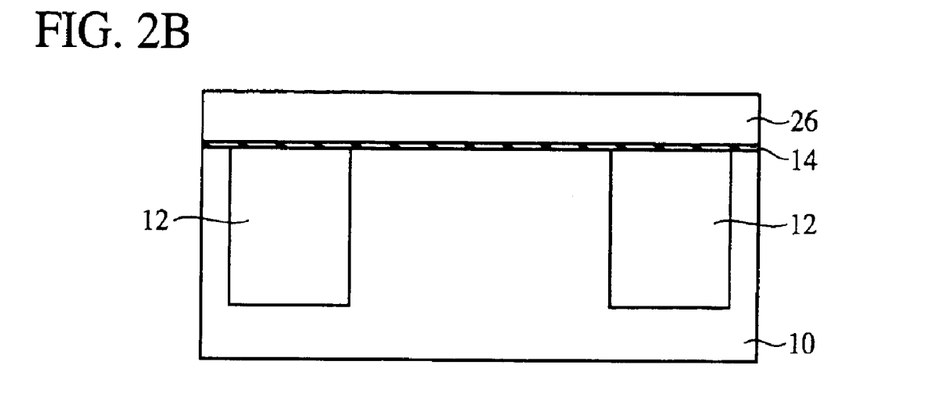

Then, a polysilicon film 26 of, e.g., a 110 nm-thickness is formed on the gate insulation film 14 by, e.g., low pressure CVD (refer to FIG. 2B). The polysilicon film 26 forms a gate electrode 16. Conditions for forming the polysilicon film 26 can be, e.g., $SiH_4$ as the raw material gas, a 0.1–0.4 Torr pressure in a vertical low pressure CVD furnace, a 590–640° C. temperature and a 200–400 sccm $SiH_4$ flow rate.

After the polysilicon film 26 has been formed, the interior of the film forming chamber of the film forming system is exposed to the atmosphere. The surface of the polysilicon film 26 is accordingly exposed to the atmosphere, and an inhomogeneous natural oxide film 28 is formed on the surface of the polysilicon film 26 (refer to FIG. 2C).

Figure 2C:
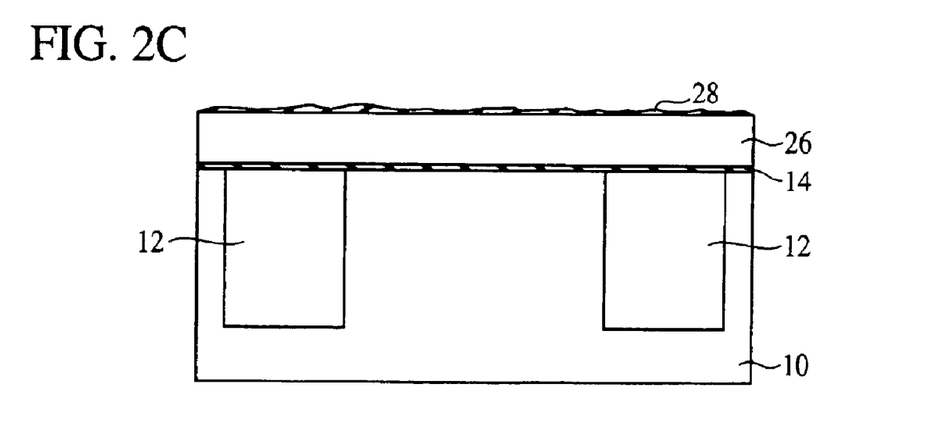

Then, SC-1 processing, DHF processing and SC-2 processing are continuously made, as will be described below, on the surface of the polysilicon film 26 with the natural oxide film 28 formed on. The SC-1 processing means the cleaning processing with APM (Ammonia/Hydrogen Peroxide Mixture: $NH_4/H_2O_2$ mixed liquid). The DHF processing means the cleaning processing with a diluted hydrofluoric acid solution. The SC-2 processing means the cleaning processing with HPM (Hydrochloric Acid/Hydrogen Peroxide/Water Mixture: $HCl/H_2O_2/H_2O$ mixture).

Figure 3A:
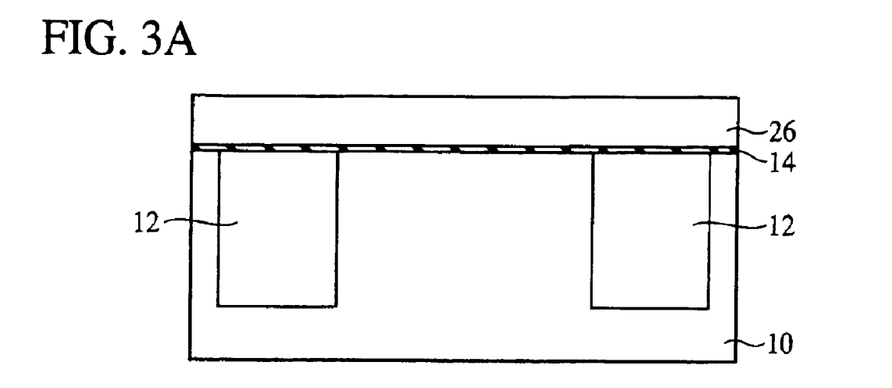
FIGS. 3A–3C are sectional views of the semiconductor device in the steps of the method for fabricating the semiconductor device according to the first embodiment of the present invention, which show the method (Part 2).

First, the SC-1 processing is made on the surface of the polysilicon film 26 with the natural oxide film 28 formed on to remove foreign objects, such as particles, etc., adhering to the surface of the polysilicon film 26.

Figure 3B:
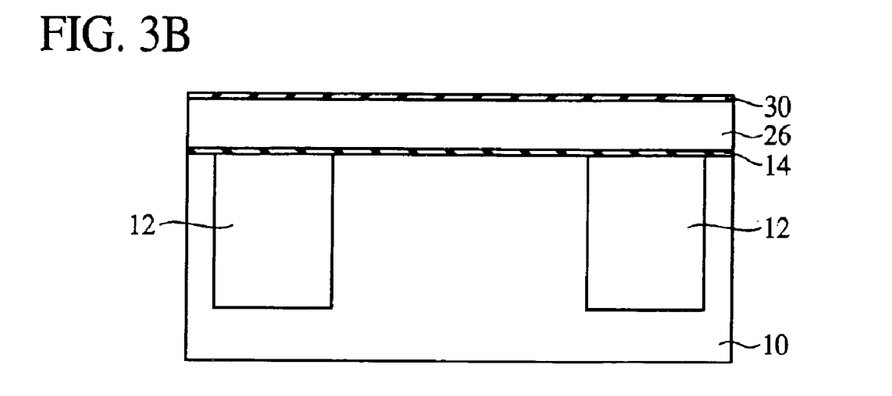

Then, the DHF processing is made on the surface of the polysilicon film 26 which has been subjected to the SC-1 processing to thereby remove the natural oxide film 28 formed on the surface of the polysilicon film 26 (refer to FIG. 3B).

Next, the SC-2 processing is made on the surface of the polysilicon film 26 from which the natural oxide film 28 has been removed to thereby form a chemical oxide film 30 which is chemically homogeneous (refer to FIG. 3B). The film thickness of the chemical oxide film 30 to be formed is, e.g., about 2 nm which is provided by suitably setting conditions, such as the processing time, etc.

Thus, a string of the SC-1 processing, the DHF processing and the SC-2 processing is made on the surface of the polysilicon film 26 to thereby remove the natural oxide film and form the chemical oxide film 30 which is homogeneous in comparison with the natural oxide film 28.

Figure 3C:
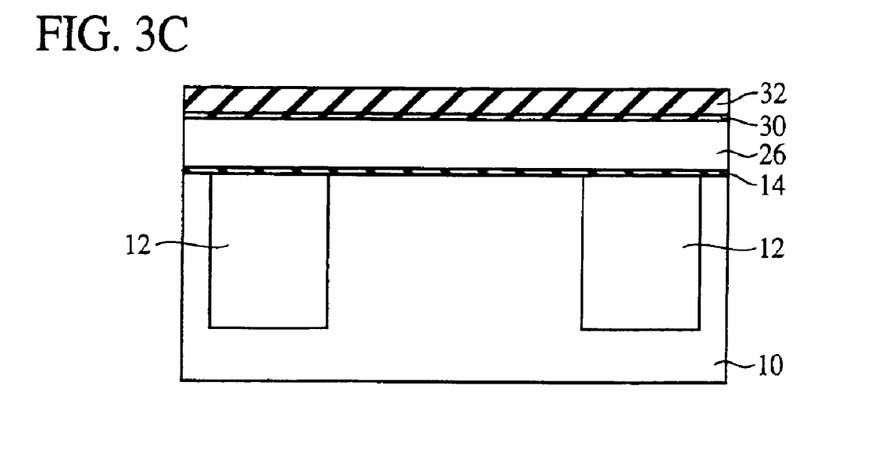

Next, a silicon oxide film 32 of, e.g., a 30 nm-thickness is formed by, e.g., CVD on the polysilicon film 26 with the chemical oxide film 30 formed on the surface (refer to FIG. 3C). The silicon oxide film 32 is used as the hard mask for forming a gate electrode 16 by etching. Conditions for forming the silicon oxide film 32 can be, e.g., TEOS (Tetraethyoxysilane) as the raw material gas, a 0.1–0.4 Torr pressure in the vertical low pressure CVD furnace, a 570–640° C., a 200–400 sccm flow rate of the TEOS and a 2–30 sccm flow rate of $O_2$. As the hard mask for forming the gate electrode 16 by etching, silicon nitride film or a silicon oxynitride film may be formed in place of the silicon oxide film 32.

Figure 4A:
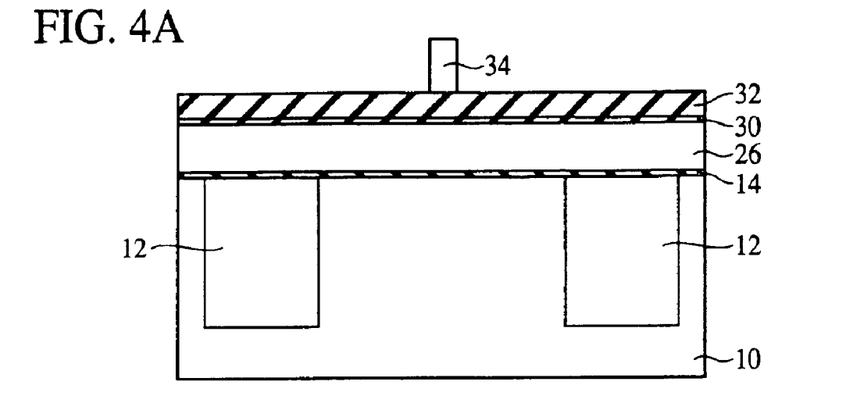
FIGS. 4A–4C are sectional views of the semiconductor device in the steps of the method for fabricating the semiconductor device according to the first embodiment of the present invention, which show the method (Part 3).

Then, a resist film 34 is formed on the silicon oxide film 32 by, e.g., spin coating and is left in the region for the gate electrode to be formed in by photolithography (refer to FIG. 4A).

Figure 4B:
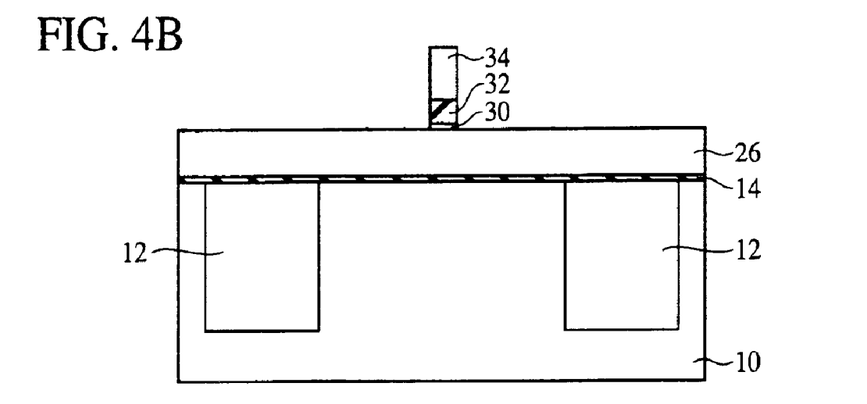

Then, with the resist film 34 as the mask, the silicon oxide film 32 to be used as the hard mask is patterned in a prescribed configuration by, e.g., RIE (refer to FIG. 4B). Conditions for etching the silicon oxide film 32 can be, e.g., $CF_4$ as the etching gas as the etching gas, a ~20 mTorr gas pressure, a 200–400 W RF power and a 50–200 sccm $CF_4$ flow rate.

When the silicon oxide film 32 is etched, the chemically homogeneous chemical oxide film 30 is also etched together with the silicon oxide film 32 and never resides on the surface of the polysilcon film 26, as does the inhomogeneous natural oxide film.

When a silicon nitride film or a silicon oxynitride film is formed as the hard mask in place of the silicon oxide film 32, the silicon nitride film or the silicon oxynitride film to be used as the hard mask is patterned by etching, and next, with the patterned silicon nitride film or the patterned silicon oxynitride film as the mask, the chemical oxide film 30 is etched off under different conditions.

Figure 4C:
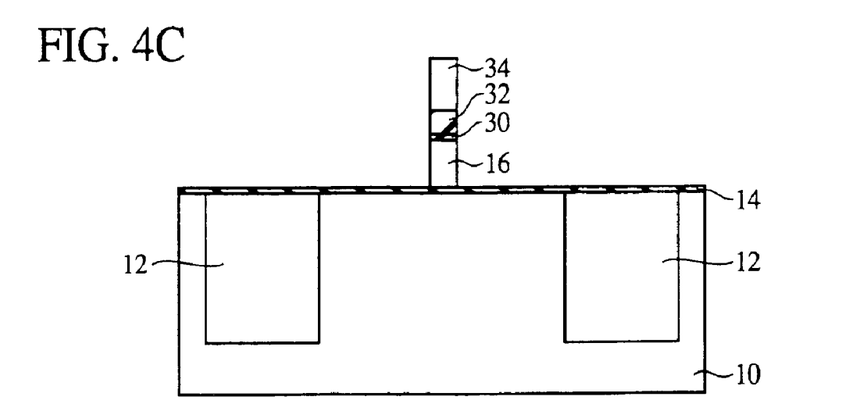

Then, with the resist film 34 and the silicon oxide film 32 as the mask, the polysilicon film 26 is patterned by, e.g., RIE to form a gate electrode 16 of the polysilicon film 26 (refer to FIG. 4C). Conditions for etching the polysilicon film 26 can be, e.g., $CF_4$ as the etching gas, a ~20 mTorr gas pressure, a 200–400 W RF power and a 50–200 sccm $CF_4$ flow rate.

In the method for fabricating a semiconductor device according to the present embodiment, the natural oxide film 28 formed on the surface of the polysilicon film 26 does not remain, contrary to the case in the prior technique, and accordingly the polysilicon film 26 in the region to be etched is not masked with the natural oxide film, which allows the polysilicon film 26 to be patterned at a stable etching rate. Thus, the residue of the polysilicon film 26 in the region other than the region for the gate electrode to be formed in can be suppressed, and accordingly, the micronized gate electrode 16 can be formed.

After the polysilicon film 26 is patterned to thereby form the gate electrode 16 under the suppression of the residue of the polysilicon film 26 in the region other than the region for the gate electrode to be formed in, the resist film 34 and the silicon oxide film 32 used as the mask are removed.

Figure 5A:
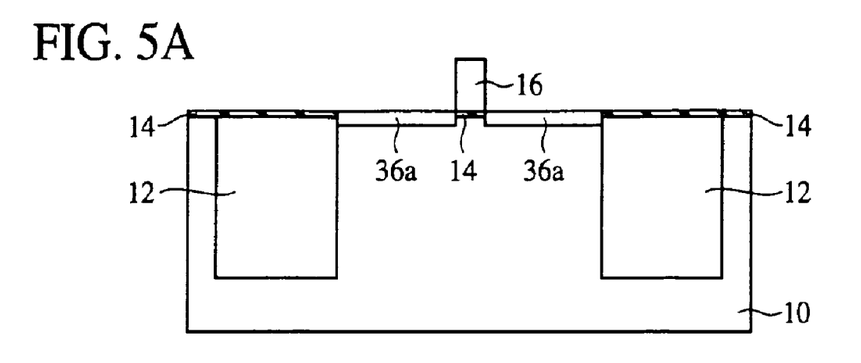
FIGS. 5A–5C are sectional views of the semiconductor device in the steps of the method for fabricating the semiconductor device according to the first embodiment of the present invention, which show the method (Part 4).

Then, with the gate electrode 16 as the mask, As (arsenic) ions are implanted to form in the silicon substrate 10 by self-alignment with the gate electrode 16 doped regions 36a which are to be extension regions 20a forming the shallow regions 20a of an extension source/drain (refer to FIG. 5A).

Conditions for the ion implantation can be, e.g., a ~5 keV ion acceleration energy and a $2 \times 10^{15}$ cm$^{-2}$ dose.

Figure 5B:
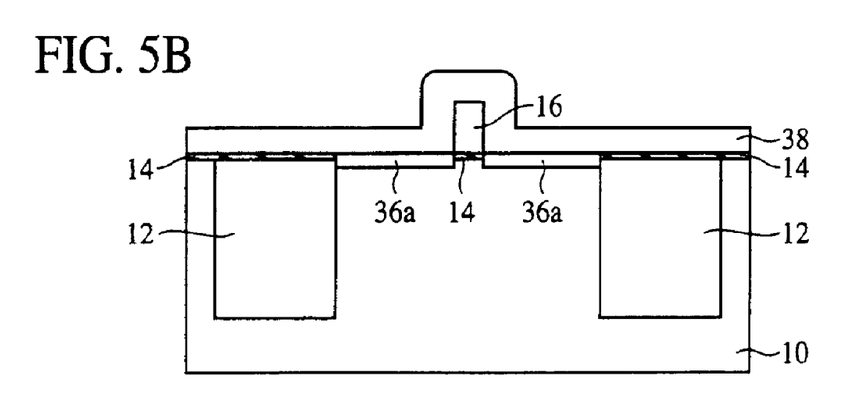

Then, a 100 nm-thickness silicon nitride film 38 is formed on the entire surface by, e.g., low pressure CVD (refer to FIG. 5B). Conditions for forming the silicon nitride film 38 can be, e.g., DCS (dichlorosilane) and NH$_3$ as the raw material gases, a 0.1–0.4 Torr pressure in the vertical low-pressure CVD furnace, a 650–750° C. temperature, a 50–200 sccm DCS flow rate and a 200–1000 sccm NH$_3$ flow rate.

Figure 5C:
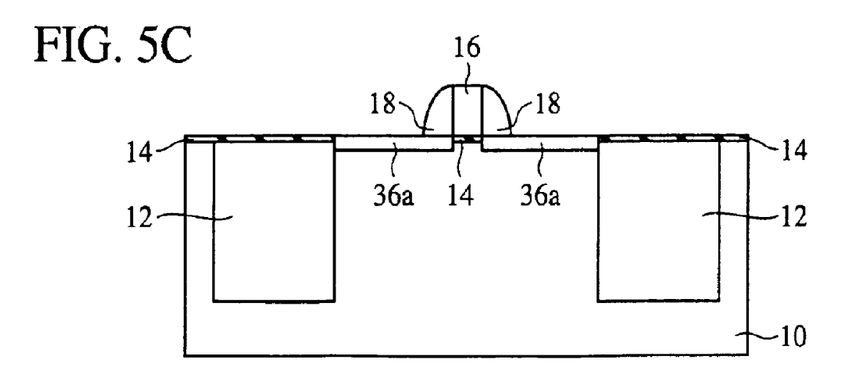

Next, the silicon nitride film 38 is anisotropically etched by, e.g., RIE to thereby form a sidewall insulation film 18 of the silicon nitride film 38 on the side wall of the gate electrode 16 (refer to FIG. 5C).

Figure 6A:
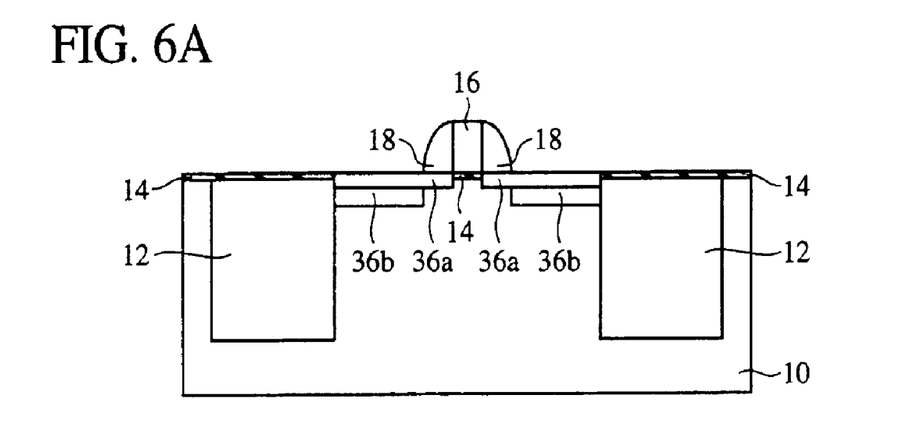
FIGS. 6A–6B are sectional views of the semiconductor device in the steps of the method for fabricating the semiconductor device according to the first embodiment of the present invention, which show the method (Part 5).

Then, with the gate electrode 16 and the sidewall insulation film 18 as the mask, P (phosphorus) ions are implanted to form doped regions 36b which are to be dopant diffused regions 20b forming the deep region of the extension source/drain (refer to FIG. 6A). Conditions for the ion implantation can be, e.g., a ~8 keV ion acceleration energy and a $1 \times 10^{16}$ cm$^{-2}$ dose.

Next, thermal processing is performed by, e.g., RTA (Rapid Thermal Annealing) to activate the dopants in the doped regions 36a, 36b. Conditions for the thermal processing by RTA can be, e.g., a nitrogen atmosphere, a 1000° C. heating temperature, and a heating time period of 5 minutes. The dopants in the doped regions 36a, 36b are thus activated to thereby form the extension regions 20a and the dopant diffused regions 20b, and the source/drain diffused layer 22 of the extension source/drain structure formed of the extension regions 20a and the dopant diffused regions 20b is formed.

Figure 6B:
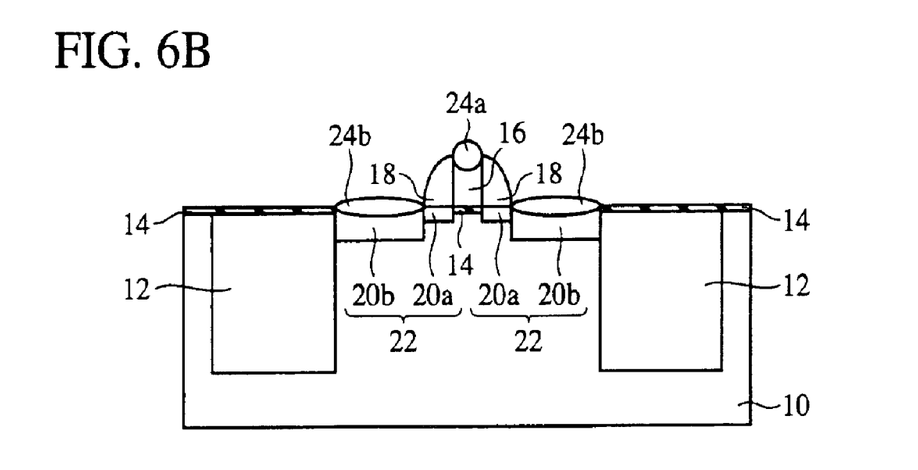

Then, low-resistance CoSi$_2$ films 24a, 24b are formed respectively selectively only on the gate electrode 16 and the source/drain diffused layer 22 by the usual salicide processing (refer to FIG. 6B).

Thus, the MIS transistor is fabricated.

As described above, according to the present embodiment, the in homogenous natural oxide film 28 formed on the surface of the polysilicon film 26 which is to be the gate electrode 16 is removed to form on the surface of the polysilicon film 26 the chemical oxide film 30 which is a homogenous oxide film, whereby the residue of the polysilicon film 26 in the region other than the region for the gate electrode to be formed in can be suppressed, which allows the gate electrode 16 micronized in, e.g., a ~50 nm-line width to be formed with high yields.

[A Second Embodiment]

Figure 7A:
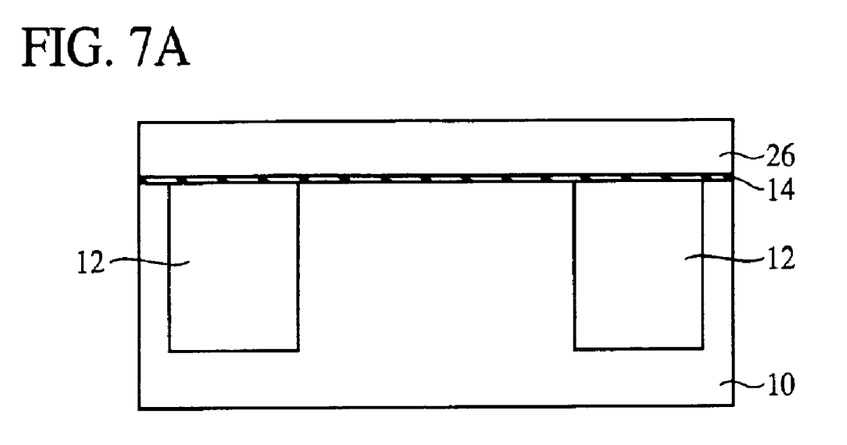
FIGS. 7A–7B are sectional views of a semiconductor device in the steps of the method for fabricating the semiconductor device according to a second embodiment of the present invention, which show the method.
Figure 7B:
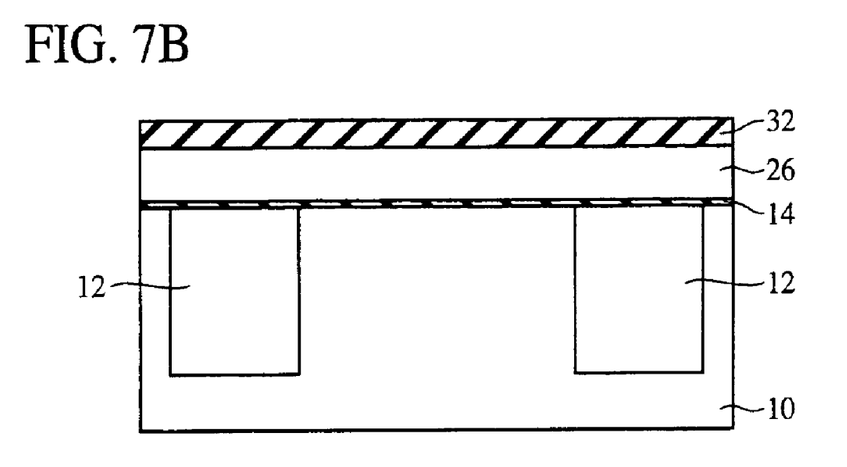

The method for fabricating a semiconductor device according to a second embodiment of the present invention will be explained with reference to FIGS. 7A–7B. FIGS. 7A–7B are sectional views of a semiconductor device in the steps of the method for fabricating a semiconductor device according to the present embodiment, which show the method. The same members of the present embodiment as those of the semiconductor device and the method for fabricating a semiconductor device according to the first embodiment are represented by the same reference numbers not to repeat or to simplify their explanation.

In the method for fabricating a semiconductor device according to the present embodiment, a polysilicon film to be patterned into a gate electrode is formed, and then the inhomogeneous oxidation of the surface of the polysilicon film is suppressed to suppress the formation of natural oxide film, whereby the residue of the polysilicon film can be suppressed to thereby form the micronized gate electrode with high yields.

When the polysilicon film 26 is formed by, e.g., a batch-type film forming system, as in the first embodiment, the interior of the film forming chamber of the system must be exposed to the atmosphere to unload out of the film forming chamber silicon substrates 10 with the polysilicon film 26 formed on. In the method for fabricating a semiconductor device according to the present embodiment, however, a single wafer film forming system, for example, is used, and the interior of the film forming chamber is not exposed to the atmosphere between the formation of the polysilicon film 26 and the formation of a silicon oxide film 32 to be used as the hard mask, and the polysilicon film 26 and the silicon oxide film 32 are formed uninterruptedly by one and the same film forming system. Thus, the oxidation of the surface of the formed polysilicon film 26 is suppressed to thereby suppress the formation of inhomogeneous natural oxide film 28 on the surface of the polysilicon film 26.

First, the polysilicon film 26 is formed by, e.g., low pressure CVD, using, e.g., a single wafer film forming system on a gate insulation film 14 on a silicon substrate 10 with element regions defined in the same way as in the first embodiment (refer to FIG. 7A).

After the polysilicon film 26 has been formed, a silicon oxide film 32 is formed on the polysilicon film 26 by, e.g., CVD, using the one and the same film forming system without exposing the interior of the film forming chamber of the film forming system to the atmosphere (refer to FIG. 7B). Thus, without exposing the surface of the polysilicon film 26 to the atmosphere between the formation of the polysiliocn film 26 and the formation of the silicon oxide film 32, the polysiliocn film 26 and the silicon oxide film 32 are formed in one and the same film forming chamber of the film forming system, whereby the formation of the inhomogeneous natural film 28 can be suppressed.

Then, in the same way as in the first embodiment, the resist film 24 is formed on the silicon oxide film 32 by, e.g., spin coating and is left in a region for the gate electrode to be formed by photolithography. To expose the resist film 24, exposure light having a wavelength of, e.g., 200 nm or below is used.

Then, with the resist film 34 as the mask, the silicon oxide film 32 to be used as the hard mask is patterned in a prescribed configuration.

Hereafter, the same steps of the first embodiment, i.e., patterning the gate electrode 16, forming a source/drain diffused layer 22, etc. follow, and the fabrication of a MIS transistor is completed.

As described above, according to the present embodiment, after the polysilicon film 26 is formed, the silicon oxide film 32 is formed on the polysilicon film 26 without exposing the surface of the polysilicon film 26 to the atmosphere, whereby the formation of the inhomogeneous natural oxide film 28 on the surface of the polysilicon film 26 can be suppressed, and accordingly the residue of the polysilicon film 26 even in the region other than the region for the gate electrode to be formed in can be suppressed, which allows the gate electrode 16 micronized in, e.g., a ~50 nm-line width to be formed with high yields.

In the present embodiment, the polysilicon film 26 and the silicon oxide film 32 are formed by one and the same film forming system. However, it is possible that the polysilicon film 26 and the silicon oxide film 32 may be formed by respective film forming system; the polysilicon film 26 is formed in the film forming chamber of one film forming system and then transferred into the film forming chamber of another film forming system without the surface thereof exposed to the atmosphere, and the silicon oxide film 32 is formed.

In the present embodiment, after the polysilicon film 26 has been formed, the silicon oxide film 32 is formed without oxidizing the surface of the polysilicon film 26. However, it is possible that after the surface of the polysilicon film 26 is homogeneously oxidized, the silicon oxide film 32 may be formed, and in this case, after the polysilicon film 26 has been formed, without exposing the surface of the polysilicon film 26 to the atmosphere, the surface of the polysilicon film 26 is homogeneously oxidized by the same oxidizing processing as in, e.g., the first embodiment.

[Modified Embodiments]

The present invention is not limited to the above-described embodiments and can cover other various modifications.

For example, in the above-described embodiments, the conducting film forming the gate electrode 16 is polysilicon film 26. The conducting film forming the gate electrode 16 is not limited to polysilicon film. As the conducting film forming the gate electrode 16, a conducting film of a silicon-based semiconductor material which forms inhomogeneous natural oxide films on the surface by exposure to the atmosphere can be used. The silicon-based semiconductor material can be, other than polysilicon, amorphous silicon, silicon germanium or others. The film to be patterned into the gate electrode 16 may be doped in advance or may be a film of such material, which is doped with ion implantation or others.

In the above-described embodiments, the gate electrode 16 is formed of the polysilicon film 26 alone. However, the gate electrode 16 is not formed essentially of the polysilicon film 26 as long as the gate electrode 16 includes a conducting film of a silicon-based semiconductor material, such as polysilicon film 16 or others.

In the above-described embodiments, to form the chemical oxide film 30, the SC-2 processing, i.e., the oxidizing processing using HPM is performed. However, a chemical liquid used in forming the chemical oxide film 30 is not limited to HPM as long as the chemical liquid is an oxidizing liquid. For example, by oxidizing the surface of the polysilicon film 26 with an oxidizing chemical liquid, such as SPM (Sulfuric Acid/Hydrogen Peroxide Mixture: $H_2SO_4$/$H_2O_2$ mixture), aqueous solution of ozone, nitric acid, etc. the chemical oxide film 30, which is a chemically homogeneous oxide film, may be formed on the surface of the polysilicon film 26.

In the above-described embodiments, the chemical oxide film 30 is formed. However, the chemical oxide film 30 is not essential if the film is a homogeneous oxide film, such as the chemical oxide film 30. For example, an oxide film in place of the chemical oxide film 30 may be formed on the polysilicon film 26 by ashing by oxygen plasmas.

In the above-described embodiments, before the chemical oxide film 30 is formed on the surface of the polysilicon film 26, foreign objects, such as particles, etc., adhering to the surface of the polysilicon film 26 are removed by the SC-1 processing. However, the processing for removing the foreign objects is not limited to SC-1 processing. For example, the foreign objects adhering to the surface of the polysilicon film 26 may be removed by means of a brush scrubber or jet scrubber. The foreign objects adhering to the surface of the polysilicon film 26 may be removed by a mixed liquid of DHF and aqueous solution of ozone.

In the above-described embodiments, before the chemical oxide film 30 is formed on the surface of the polysilicon film 26, the natural oxide film 28 formed on the surface of the polysilicon film 26 is removed by DHF processing. However, the processing for removing the natural oxide film 28 is not limited to DHF processing. For example, by plasmas of a mixed gas of $CF_4$, $O_2$ and $N_2$, the surface of the polysilicon film 28 is homogeneously oxidized while the natural oxide film 28 is removed. In this case, the plasma processing is performed at the respective flow rates of $CF_4$, $O_2$ and $N_2$ gases of 35 sccm, 500 sccm and 50 sccm, at a 400 W power and for 120 seconds.

In the above-described embodiments, the transistor is of n type, but the present invention is applicable to the fabrication of p type transistor.

What is claimed is:

1. A method for fabricating a semiconductor device comprising the steps of:

forming a film containing a silicon above a semiconductor substrate;

removing a natural oxide film on the surface of the film.

oxidizing the surface of the film with the natural oxide film removed to form an oxide film which is homogeneous in comparison with the natural oxide film;

forming a mask on the oxide film formed on the surface of the film; and etching the film with the mask to form a gate electrode including the film.

2. A method for fabricating a semiconductor device comprising the steps of :

forming a film containing a silicon above a semiconductor substrate with a gate insulation film formed therebetween;

exposing the semiconductor substrate to the atmosphere;

removing a natural oxide film formed on the surface of the film;

oxidizing the surface of the film with the natural oxide film removed to form an oxide film which is homogeneous in comparison with the natural oxide film;

forming a mask on the oxide film formed on the surface of the film; and etching the film with the mask to form a gate electrode including the film.

3. A method for fabricating a semiconductor device according to claim 1, further comprising, after the step of forming the mask, the step of etching the oxide film with the mask.

4. A method for fabricating a semiconductor device according to claim 2, further comprising, after the step of forming the mask, the step of etching the oxide film with the mask.

5. A method for fabricating a semiconductor device according to claim 1, wherein In the step of forming the oxide film, the surface of the film is oxidized with an oxidizing chemical liquid to form the oxide film on the surface of the film.

6. A method for fabricating a semiconductor device according to claim 2, wherein In the step of forming the oxide film, the surface of the film is oxidized with an oxidizing chemical liquid to form the oxide film on the surface of the film.

7. A method for fabricating a semiconductor device according to claim 5, wherein the oxidizing chemical liquid is HPM, SPM, aqueous solution of ozone or nitric acid.

8. A method for fabricating a semiconductor device according to claim 6, wherein
the oxidizing chemical liquid is HPM, SPM, aqueous solution of ozone or nitric acid.

9. A method for fabricating a semiconductor device according to claim 1, wherein
in the step of forming the oxide film, the surface of the film is exposed to oxygen plasmas, oxidizing the surface of the film to thereby form the oxide film on the surface of the film.

10. A method for fabricating a semiconductor device according to claim 2, wherein
in the step of forming the oxide film, the surface of the film is exposed to oxygen plasmas, oxidizing the surface of the film to thereby form the oxide film on the surface of the film.

11. A method for fabricating a semiconductor device according to claim 1, wherein
in the step of removing the natural oxide film, the natural oxide film is removed by hydrofluoric acid processing.

12. A method for fabricating a semiconductor device according to claim 2, wherein
in the step of removing the natural oxide film, the natural oxide film is removed by hydrofluoric acid processing.

13. A method for fabricating a semiconductor device according to claim 1, further comprising, before the step of removing the natural oxide film, the step of
removing foreign objects adhering to the surface of the film.

14. A method for fabricating a semiconductor device according to claim 2, further comprising, before the step of removing the natural oxide film, the step of
removing foreign objects adhering to the surface of the film.

15. A method for fabricating a semiconductor device according to claim 13, wherein
in the step of removing the foreign objects, the surface of the film is cleaned with APM to remove the foreign objects adhering to the surface of the film.

16. A method for fabricating a semiconductor device according to claim 14, wherein
in the step of removing the foreign objects, the surface of the film is cleaned with APM to remove the foreign objects adhering to the surface of the film.

* * * * *